(12) United States Patent
Ma

(10) Patent No.: US 10,937,661 B2
(45) Date of Patent: Mar. 2, 2021

(54) METHOD FOR REMOVING SILICON OXIDE AND INTEGRATED CIRCUIT MANUFACTURING PROCESS

(71) Applicant: BEIJING NAURA MICROELECTRONICS EQUIPMENT CO., LTD., Beijing (CN)

(72) Inventor: Zhenguo Ma, Beijing (CN)

(73) Assignee: BEIJING NAURA MICROELECTRONICS EQUIPMENT CO., LTD., Beijing (CN)

(*) Notice: Subject to any disclaimer, the term of this patent is extended or adjusted under 35 U.S.C. 154(b) by 0 days.

(21) Appl. No.: 16/372,849

(22) Filed: Apr. 2, 2019

(65) Prior Publication Data

US 2019/0244828 A1 Aug. 8, 2019

Related U.S. Application Data

(63) Continuation of application No. PCT/CN2017/105369, filed on Oct. 9, 2017.

(30) Foreign Application Priority Data

Oct. 8, 2016 (CN) .......................... 201610879096.2

(51) Int. Cl.
*H01L 21/311* (2006.01)
*H01L 21/67* (2006.01)
*H01L 21/033* (2006.01)

(52) U.S. Cl.
CPC .... *H01L 21/31116* (2013.01); *H01L 21/0337* (2013.01); *H01L 21/311* (2013.01); *H01L 21/67069* (2013.01)

(58) Field of Classification Search
None
See application file for complete search history.

(56) References Cited

U.S. PATENT DOCUMENTS 5,022,961 A * 6/1991 Izumi .................. C04B 41/5346
134/3
5,228,206 A * 7/1993 Grant ...................... F26B 3/283
34/275

(Continued)

FOREIGN PATENT DOCUMENTS

| CN | 103828029 A | 5/2014 |
| CN | 103928387 A | 7/2014 |
| KR | 20050073679 A1 | 7/2005 |

OTHER PUBLICATIONS

The World Intellectual Property Organization (WIPO) International Search Report and Written Opinion for PCT/CN2017/105369 dated Jan. 12, 2018 6 Pages.

*Primary Examiner* — Allan W. Olsen
(74) *Attorney, Agent, or Firm* — Anova Law Group, PLLC

(57) ABSTRACT

A method for removing silicon oxide from a wafer and an integrated circuit manufacturing process are provided. The method includes: introducing a dehydrated hydrogen fluoride gas and a dehydrated alcohol gas into a process chamber; mixing the dehydrated hydrogen fluoride gas with the dehydrated alcohol gas to generate gaseous etchants; allowing reactions between the etchants and the wafer in the process chamber under a high pressure maintained in the process chamber to improve an etching selectivity; and pumping out reaction products from the process chamber.

10 Claims, 5 Drawing Sheets

(56) References Cited

U.S. PATENT DOCUMENTS

| | | | | |
|---|---|---|---|---|
| 5,439,553 A * | 8/1995 | Grant | H01L 21/31116 | 216/58 |
| 5,571,375 A * | 11/1996 | Izumi | C04B 41/5346 | 438/743 |
| 5,814,562 A * | 9/1998 | Green | H01L 21/02046 | 134/1.2 |
| 5,922,624 A * | 7/1999 | Verhaverbeke | H01L 21/31116 | 257/E21.227 |
| 6,806,205 B2 * | 10/2004 | Jang | B81C 1/00936 | 216/58 |
| 7,141,504 B1 * | 11/2006 | Bhardwaj | H01L 21/31138 | 438/700 |
| 7,217,658 B1 * | 5/2007 | Bayman | C23C 16/045 | 438/680 |
| 7,365,016 B2 * | 4/2008 | Ouellet | B81C 1/00476 | 216/73 |
| 7,482,247 B1 * | 1/2009 | Papasouliotis | C23C 16/44 | 438/437 |
| 9,651,432 B2 * | 5/2017 | Fuji | G01L 1/125 | |
| 2002/0025684 A1 * | 2/2002 | Butterbaugh | H01L 21/67063 | 438/712 |
| 2004/0018683 A1 * | 1/2004 | Kim | H01L 28/91 | 438/257 |
| 2004/0100518 A1 * | 5/2004 | Silverbrook | G06K 1/121 | 347/20 |
| 2006/0128158 A1 * | 6/2006 | Sugiura | B81C 1/00476 | 438/706 |
| 2006/0189064 A1 * | 8/2006 | Shim | H01L 28/91 | 438/210 |
| 2006/0207968 A1 * | 9/2006 | Mumbauer | H01L 21/31116 | 216/58 |
| 2009/0127648 A1 | 5/2009 | Chen et al. | | |
| 2013/0260533 A1 * | 10/2013 | Sapre | H01L 21/3065 | 438/435 |
| 2014/0369530 A1 * | 12/2014 | Fuji | G01L 1/205 | 381/122 |
| 2015/0082900 A1 * | 3/2015 | Fuji | G01L 9/007 | 73/779 |
| 2015/0270140 A1 * | 9/2015 | Gupta | H01L 21/32136 | 216/67 |
| 2016/0196984 A1 * | 7/2016 | Lill | H01J 37/32009 | 438/694 |
| 2017/0207067 A1 * | 7/2017 | Kaelberer | H01J 37/32449 | |
| 2020/0118836 A1 * | 4/2020 | Ding | H01L 21/383 | |

* cited by examiner

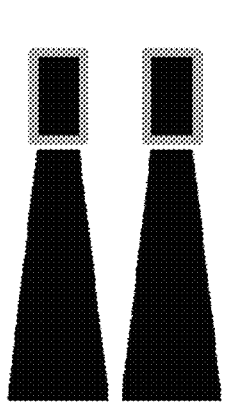
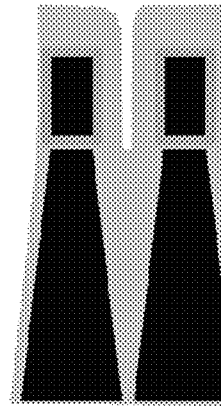
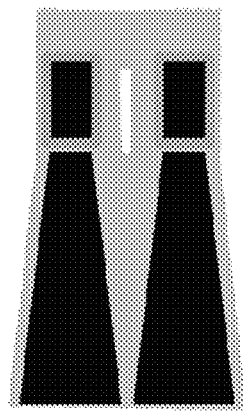
FIG. 4A(PRIOR ART)   FIG. 4B(PRIOR ART)   FIG. 4C(PRIOR ART)
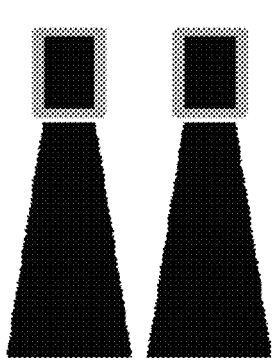
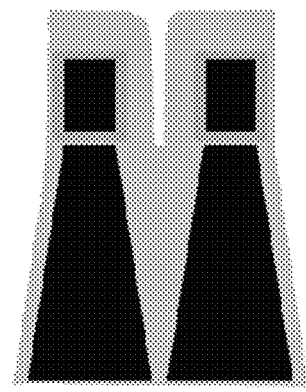
FIG. 5A   FIG. 5B
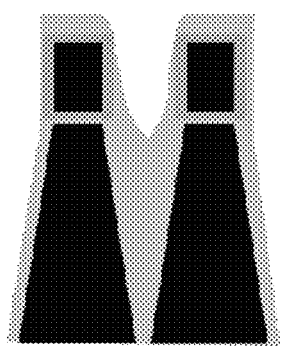
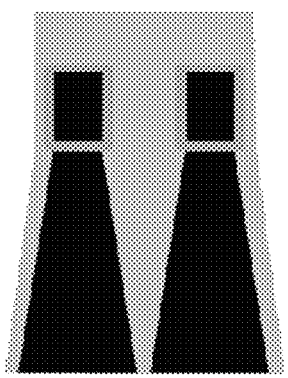
FIG. 5C   FIG. 5D

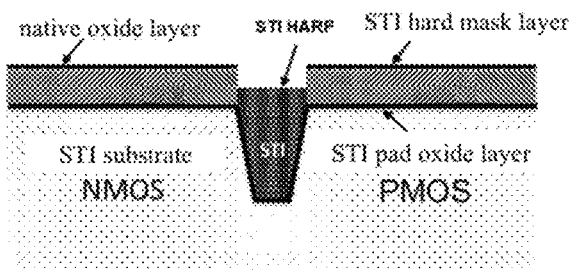
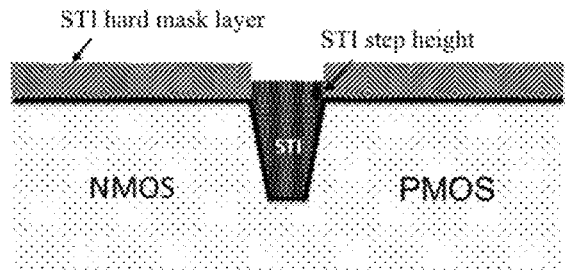
FIG. 6A    FIG. 6B
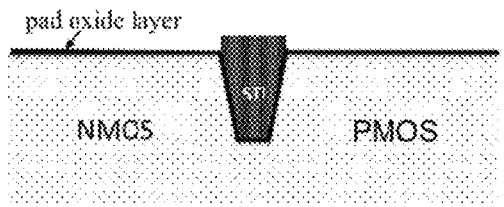
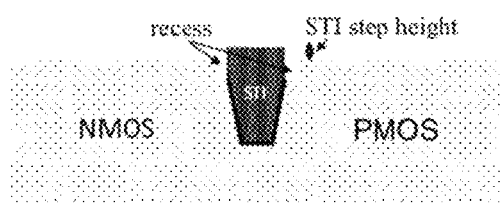
FIG. 7A    FIG. 7B
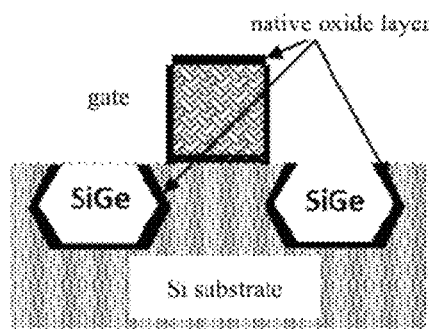
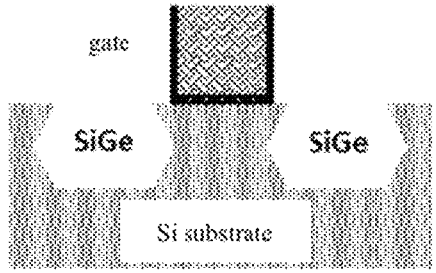
FIG. 8A    FIG. 8B
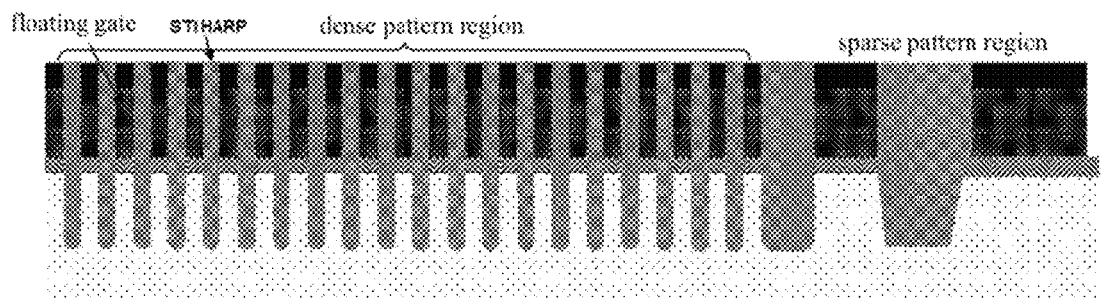
FIG. 9A

METHOD FOR REMOVING SILICON OXIDE AND INTEGRATED CIRCUIT MANUFACTURING PROCESS

CROSS-REFERENCE TO RELATED APPLICATION

This application is a continuation application of International Application No. PCT/CN2017/105369, filed on Oct. 9, 2017, which claims priority of Chinese Patent Application No. 201610879096.2, filed on Oct. 8, 2016, the entire content of all of which is incorporated herein by reference.

TECHNICAL FIELD

The present disclosure relates to the field of integrated circuit manufacturing process and, more particularly, relates to a method for removing silicon oxide from a wafer in an integrated circuit manufacturing process and an integrated circuit manufacturing process using the method.

BACKGROUND

In the field of integrated circuit manufacturing process, integrated circuits are currently manufactured using silicon-based materials. When silicon (or polysilicon) is placed in air, the surface is naturally oxidized to form a dense layer of silicon oxide ($SiO_2$), as shown in FIG. 1A. In some processes, for example, in a metal silicide process, a metal nickel-platinum (NiPt) film is in direct contact with a substrate of the silicon-based material. If a layer of $SiO_2$ is on a surface of the substrate, the resistivity may be increased, which may affect device performance, so it is necessary to remove the layer of $SiO_2$ before a subsequent manufacturing process. While removing the layer of $SiO_2$, other films or structures must be protected from being removed or damaged. As shown in FIG. 1A, the linewidth of a spacer (made of silicon nitride ($Si_3N_4$)) may affect the device's electrical properties, such as leakage etc. Therefore, it is necessary to keep the spacer ($Si_3N_4$) from being removed while removing $SiO_2$.

As shown in FIG. 1B, the conventional processes mostly use a wet etching process, a plasma dry etching process, etc. to remove $SiO_2$, which may have a low etching selectivity to $Si_3N_4$ and may remove excessive spacer, thereby reducing the spacer size, increasing leakage and affecting device performance.

Therefore, it is necessary to develop a method with high selectivity and high efficiency for removing silicon oxide from a wafer, which may be applied to an integrated circuit manufacturing process.

SUMMARY

One aspect of the present disclosure provides a method for removing silicon oxide from a wafer. The method includes: introducing a dehydrated hydrogen fluoride gas and a dehydrated alcohol gas into a process chamber; mixing the dehydrated hydrogen fluoride gas with the dehydrated alcohol gas to generate gaseous etchants; allowing reactions between the etchants and the wafer in the process chamber under a high pressure maintained in the process chamber to improve an etching selectivity; and pumping out reaction products from the process chamber.

Another aspect of the present disclosure provides an integrated circuit manufacturing process. The integrated circuit manufacturing process includes removing silicon oxide from a wafer by a removal method. The removal method includes introducing a dehydrated hydrogen fluoride gas and a dehydrated alcohol gas into a process chamber; mixing the dehydrated hydrogen fluoride gas with the dehydrated alcohol gas to generate gaseous etchants; allowing reactions between the etchants and the wafer in the process chamber under a high pressure maintained in the process chamber to improve an etching selectivity; and pumping out reaction products from the process chamber.

Other aspects or embodiments of the present disclosure can be understood by professionals skilled in the art in light of the description, the claims, and the drawings of the present disclosure.

DESCRIPTION OF THE DRAWINGS

The following drawings are merely for illustrative purposes according to various embodiments and are not intended to limit the scope of the present disclosure.

To more clearly describe the above-mentioned and other objectives, technical solutions and advantages of the present disclosure, the present disclosure is further illustrated in detail with reference to the accompanying drawings in conjunction with embodiments. In the exemplary embodiments of the present disclosure, same reference numerals generally denote some components.

FIGS. 4A, 4B and 4C respectively illustrate schematics of profile modification of STI (shallow trench isolation) HARP (high aspect ratio process) gap-fill deposition according to the conventional technology;

FIGS. 5A, 5B, 5C, and 5D respectively illustrate schematics of effects of removing silicon oxide from a wafer in profile modification of STI HARP gap-fill deposition according to various disclosed embodiments of the present disclosure;

FIGS. 6A and 6B respectively illustrate schematics of a device having a native oxide layer and a device after removing the native oxide layer according to various disclosed embodiments of the present disclosure;

FIGS. 7A and 7B respectively illustrate schematics of a device having a pad oxide layer and a device after removing the pad oxide layer according to various disclosed embodiments of the present disclosure;

FIGS. 8A and 8B respectively illustrate schematics of a device having a native oxide layer and a device after removing the native oxide layer according to various disclosed embodiments of the present disclosure; and FIGS. 9A and 9B respectively illustrate schematics of an integrated circuit device having oxide recesses and an effect of removing silicon oxide of a device according to various disclosed embodiments of the present disclosure.

DETAILED DESCRIPTION

Figure 1A:
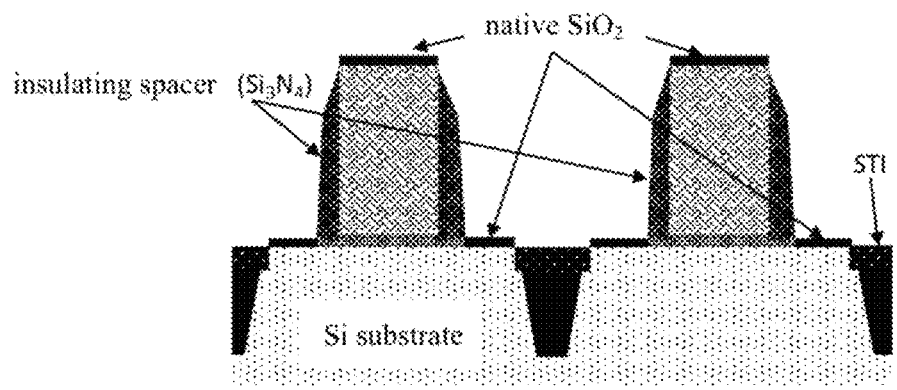
FIG. 1A illustrates a schematic of an integrated circuit device having a native oxide layer.
Figure 1B:
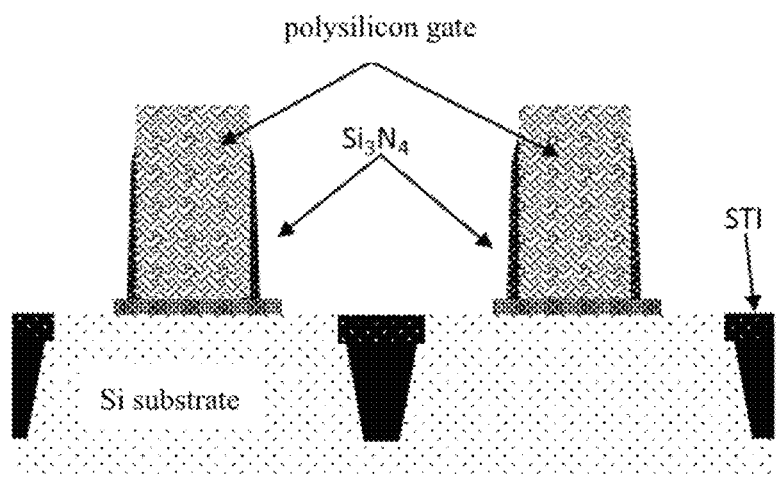
FIG. 1B illustrates a schematic of an effect of removing silicon oxide according to a method of the conventional technology.

The present disclosure is described in detail below with reference to the accompanying drawings. Although the preferred embodiments of the present disclosure are shown in the drawings, it should be understood that the present disclosure may be embodied in various forms and not limited by the embodiments set forth herein. Instead, the embodiments are provided to make the present disclosure more thorough and complete, and the scope of the present disclosure may be fully conveyed to those skilled in the art.

A method and a manufacturing process for removing silicon oxide from a wafer are provided. The method includes: introducing a dehydrated hydrogen fluoride gas and a dehydrated alcohol gas into a process chamber; mixing the dehydrated hydrogen fluoride gas with the dehydrated alcohol gas to generate gaseous etchants; allowing reactions between the etchants and the wafer in the process chamber under a high pressure maintained in the process chamber to improve an etching selectivity; and pumping out reaction products from the process chamber.

Figure 2:
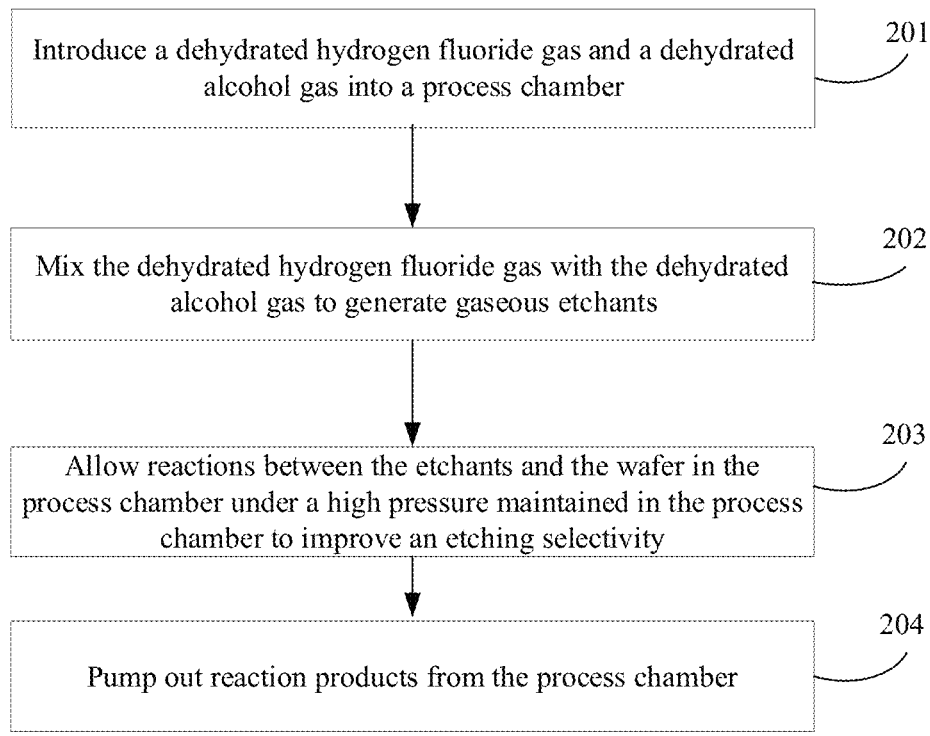
FIG. 2 illustrates a flow chart corresponding to certain stages of an exemplary method for removing silicon oxide from a wafer according to various disclosed embodiments of the present disclosure.

FIG. 2 illustrates a flow chart corresponding to certain stages of an exemplary method for removing silicon oxide from a wafer according to various disclosed embodiments of the present disclosure.

In one embodiment, the method for removing silicon oxide from the wafer according to the present disclosure may include: step 201, where a dehydrated hydrogen fluoride gas and a dehydrated alcohol gas may be introduced into a process chamber; step 202, where the dehydrated hydrogen fluoride gas may be mixed with the dehydrated alcohol gas to generate gaseous etchants; step 203, where the etchants may be reacted with substances to-be-removed such as silicon oxide from the surface of the wafer in the process chamber, and the process chamber may be maintained at a high pressure to increase an etching selectivity; and step 204, where reaction products may be pumped out from the process chamber.

In one embodiment, gaseous etchants may directly react with silicon oxide under high pressure and the reaction products may be pumped out after the reaction is completed, which may remove silicon oxide with high selectivity and high efficiency.

The method for removing silicon oxide from the wafer according to the present disclosure are described in detail hereafter.

In one embodiment, the substance to-be-removed on the wafer surface may be silicon oxide. The method for removing silicon oxide from the wafer according to the present disclosure may include: step 201, where the dehydrated hydrogen fluoride gas and the dehydrated alcohol gas may be introduced into the process chamber; step 202, where the dehydrated hydrogen fluoride gas may be mixed with the dehydrated alcohol gas to generate gaseous etchants; step 203, where the etchants may be reacted with silicon oxide from the surface of the wafer in the process chamber, and the process chamber may be maintained at a high pressure to increase the etching selectivity; and step 204, where the reaction products may be pumped out from the process chamber.

Optionally, the reaction conditions may include a pressure in the process chamber of about 30 torr to 300 torr and a temperature in the process chamber of about 20° C. to 80° C. Furthermore, the reaction conditions may include the pressure in the process chamber of about 200 torr and the temperature in the process chamber of about 40° C. The higher the pressure is in the process chamber in the range of about 30 torr to 300 torr, the easier the gaseous etchants (reaction gases) may condense on the surface of the wafer and react with $SiO_2$. In such way, the removal rate of $SiO_2$ may increase greatly, but the removal rate of $Si_3N_4$ may not increase at the same time, which may greatly increase the removal selectivity ratio (e.g., etching selectivity) of $SiO_2$ to $Si_3N_4$ (or polysilicon, HARP deposition, etc.).

Optionally, a flow rate of the hydrogen fluoride gas may be about 100 sccm to 500 sccm and a flow rate of the alcohol gas may be about 100 sccm to 1000 sccm. Furthermore, the flow rate of the hydrogen fluoride gas may be about 150 sccm to 225 sccm and the flow rate of the alcohol gas may be about 200 sccm to 450 sccm.

Optionally, the ratio of the flow rate of the hydrogen fluoride gas to the flow rate of the alcohol gas may be about (0.8-1.2):1. For example, the ratio of the flow rate of the hydrogen fluoride gas to the flow rate of the alcohol gas may be about 0.8:1, 1:1 or 1.2:1. Furthermore, the ratio of the flow rate of the hydrogen fluoride gas to the flow rate of the alcohol gas may be about 1:1. By making the flow rates of the hydrogen fluoride gas and the alcohol gas similar, the uniformity of removing silicon oxide may be improved.

Optionally, the alcohol gas may be at least one of C1 to C8 monohydric alcohol gases. Furthermore, the alcohol gas may be at least one of methanol ($CH_3OH$), ethanol ($C_2H_5OH$), and isopropyl alcohol (IPA).

When the alcohol gas is vaporized methanol, the etchants are $HF_2^-$ and $CH_3OH_2^+$ and the reaction products are silicon tetrafluoride, methanol, and water. When methanol ($CH_3OH$) is used, the reaction formula of the method for removing silicon oxide from the wafer according to the present disclosure may be expressed as:

$$HF+CH_3OH \rightarrow HF_2^- + CH_3OH_2^+ \qquad (1)$$

$$HF_2^- + CH_3OH_2^+ + SiO_2 \rightarrow SiF_4 + CH_3OH + H_2O \qquad (2)$$

The dehydrated HF gas and the dehydrated $CH_3OH$ gas may be mixed inside the chamber to generate gaseous etchants $HF_2^- + CH_3OH_2^+$. The pressure in the process chamber may be set to about 200 torr and the temperature in the chamber may be about 40° C. Mixed $HF_2^-$ and $CH_3OH_2^+$ may react with $SiO_2$ to generate $SiF_4$, $CH_3OH$ and $H_2O$. $CH_3OH$ may have strong water absorption, which may reduce the $H_2O$ residual on the wafer surface. Meanwhile, the reaction products such as $SiF_4$, $CH_3OH$ and $H_2O$ may be pumped out after the reaction is completed.

In practical applications, the process chamber used in the method for removing silicon oxide from the wafer according to the present disclosure may be integrated with a subsequent process on a vacuum platform. In such way, after removing the $SiO_2$ on the wafer surface, the subsequent process may be performed without damaging the vacuum environment, and the wafer may be prevented from being re-oxidized in a non-vacuum environment again before proceeding to the subsequent process, which may affect the subsequent process. For example, the vacuum environment may be maintained for the subsequent process, including deposition of platinum-nickel (NiPt) and/or silicon germanium (SiGe) for forming the silicide.

The advantages of the method for removing silicon oxide from the wafer according to the present disclosure are the following.

1) The selectivity may be high. The selectivity of the present disclosure may be improved by a high-pressure process. When the high-pressure process (e.g., the process pressure of about 200 torr) is used, the gaseous etchants may be more likely to condense on the surface of the wafer and react with $SiO_2$. In such way, the removal rate of $SiO_2$ may increase greatly, but the removal rate of $Si_3N_4$ may not increase, thereby increasing the removal rate of $SiO_2$ and reducing the damage to the substrate. That is, the method provided by the present disclosure may greatly increase the removal selectivity ratio of $SiO_2$ to $Si_3N_4$ (or polysilicon, HARP deposition, etc.).

2) Plasma may not be used, and other by-products may not be easy to generate, which may not damage the substrate, and may reduce particle contamination, keep the chamber clean, and also reduce equipment costs.

3) $SiO_2$ may be removed by a chemical reaction. Since there are no solid reaction products, the reaction products may be pumped out. FIGS. 5A and 5B illustrate other schematics of effects of removing silicon oxide from the wafer according to the present disclosure. As shown in FIGS. 5A-5D, since the reaction products diffuse well, the removal amount of $SiO_2$ in small voids in a dense region and in a sparse region may be consistent, and the reaction products such as gaseous $SiF_4$ may be easily pumped out, which may not cause the small voids to be clogged, may have a good and high cleaning effect on the small voids and also a high removal uniformity. Moreover, the method provided in the embodiments of the present disclosure may also improve the loading effect of the pad oxide layer removal and the STI recess etching, so the trench depths of large and small voids may be etched consistently and the STI heights may be also consistent. Furthermore, $CH_3OH$ and $H_2O$ may also be easily pumped out, which may not condense on the chamber wall and may have less particles.

4) The method for removing silicon oxide from the wafer provided by embodiments of the present disclosure may have a low process temperature, such as about 20° C. to 80° C., so high temperature heating may not be required, and a cooling step corresponding to the high temperature step may not be required accordingly. In such way, the reaction process may be simple, and the reaction may be completed in one step, which may not only improve the process efficiency and capacity, but also at least save the cost generated by the heating step and the cooling step.

In accordance with another aspect of the present disclosure, an integrated circuit manufacturing process may also be provided, and the manufacturing process may include the above-mentioned methods for removing silicon oxide from the wafer.

The integrated circuit manufacturing process provided by the present disclosure may use the above-mentioned methods provided by the embodiments of the present disclosure to remove silicon oxide from the wafer. Therefore, compared with integrated circuit manufacturing processes in the conventional technology using a wet etching process or a plasma etching process to remove silicon oxide, the integrated circuit manufacturing process provided by the present disclosure may also improve the removal efficiency of silicon oxide, reduce the damage to the substrate, keep the chamber clean, reduce or even eliminate the particle contamination caused by the reaction products, and may also have the characteristics of simple reaction processes, high process efficiency and capacity, low costs, etc.

To facilitate understanding of the aspects and effects of the present disclosure, various embodiments are described hereafter. It should be understood by those skilled in the art that embodiments are only for facilitating understanding of the present disclosure and any specific details are not intended to limit the present disclosure.

Embodiment 1: Profile Modification of STI HARP Gap-Fill Deposition

FIGS. 4A, 4B and 4C respectively illustrate schematics of profile modification of STI HARP gap-fill deposition according to the conventional technology. FIG. 4A illustrates a device after STI structure etching. FIG. 4B illustrates the device during the STI HARP deposition. FIG. 4C illustrates the device with generated voids after the STI HARP deposition. As shown in FIGS. 4A, 4B and 4C, the STI HARP deposition may use a chemical vapor deposition (CVD) process. Due to a large aspect ratio of 28 nm STI structure and a poor profile of STI structure etching, voids may be easily generated during the STI HARP deposition. The conventional technology used in FIGS. 4A, 4B, and 4C may produce solid reaction products, and have low cleaning efficiency for small voids and low capacity.

In one embodiment, the integrated circuit manufacturing process may include a sub-process for a profile modification of a STI HARP gap-fill deposition. The sub-process may include performing an HARP deposition by a CVD process for forming a STI structure having a certain thickness; etching the STI structure having the certain thickness to provide an enlarged opening; and repeatedly performing the HARP deposition and the etching of the STI structure in the enlarged opening, till a complete STI structure is formed, where the etching of the STI structure includes the method for removing silicon oxide.

FIGS. 5A, 5B and 5C respectively illustrate schematics of effects of removing silicon oxide from a wafer in profile modification of STI HARP gap-fill deposition according to various disclosed embodiments of the present disclosure. FIG. 5A illustrates a device after STI structure etching. FIG. 5B illustrates the device during the STI HARP deposition. FIG. 5C illustrates the device with STI structure opening adjustment using the method for removing silicon oxide from the wafer of the present disclosure. FIG. 5D illustrates the device after the STI HARP deposition.

In one embodiment, the method for removing silicon oxide from the wafer according to the present disclosure may be described hereafter. The dehydrated HF gas and the dehydrated $CH_3OH$ gas may be mixed to generate gaseous etchants $HF_2^-$ and $CH_3OH_2^+$. Then etchants may be introduced into the process chamber, and react with $SiO_2$ on the surface of the wafer in the process chamber to generate $SiF_4$, $CH_3OH$ and $H_2O$, where the process conditions in the process chamber are: the pressure in the chamber setting to about 200 torr and the temperature in the chamber of about 40° C. $SiF_4$, $CH_3OH$ and $H_2O$ may be pumped out after the reaction is completed.

As shown in FIGS. 5A, 5B, 5C, and 5D, in the integrated circuit manufacturing process provided by the embodiments of the present disclosure, the STI structure may be etched to make the opening larger after depositing a certain thickness of HARP deposition (depositing a layer of SiO2) by a CVD process, which may avoid generating voids. Using the method of the present disclosure to remove $SiO_2$, the non-solid reaction products may be easily pumped out, which may keep the chamber clean, and reduce or even eliminate the particle contamination caused by the reaction products. The method provided in the embodiments may not require high temperature heating, have a simple reaction process, and have the characteristics of high process efficiency, high process capacity and low costs. Furthermore, the method provided by the present disclosure may have the process pressure of about 200 torr and the process temperature of about 40° C., thereby improving the etching selectivity of $SiO_2$ to HARP deposition, etc. In such way, the removal efficiency of silicon oxide from the wafer may be improved and the damage to the substrate may be reduced, thereby controlling the opening profile and increasing the filling ability of the CVD HARP gap.

Embodiment 2: STI Structure $Si_3N_4$ Native Oxide Layer Removal

In one embodiment, the integrated circuit manufacturing process may include a sub-process for removing a $SiO_2$ native oxide layer formed on a hard mask layer of a STI structure, where the mask layer of the STI structure is silicon nitride. The sub-process may include using the method for removing silicon oxide to etch the $SiO_2$ native oxide layer on the hard mask layer of the STI structure; and controlling an etching selectivity of the $SiO_2$ native oxide layer over a STI HARP deposition to remove the $SiO_2$ native oxide layer with an increased speed and avoid excessive etching of the STI HARP deposition.

FIGS. 6A and 6B respectively illustrate schematics of a device having a native oxide layer and a device after removing the native oxide layer according to various disclosed embodiments of the present disclosure.

As shown in FIG. 6A, the integrated circuit manufacturing process may use $Si_3N_4$ as the hard mask layer of the STI structure, and a $H_3PO_4$ wet process may be required to remove the hard mask layer. However, the wafer with the hard mask layer may be naturally oxidized on the surface of the $Si_3N_4$ layer to form a dense $SiO_2$ layer after being placed in the air for a period of time, and the $SiO_2$ native oxide layer may be removed first before removing $Si_3N_4$. If the $H_3PO_4$ wet process, which is used to remove the hard mask layer, is used to remove the $SiO_2$, the removing rate of $SiO_2$ may be very slow. Furthermore, the STI HARP deposition in FIG. 6A may be the $SiO_2$ layer deposited by the CVD process, and the $SiO_2$ layer may have a low density and be easily removed. When the $SiO_2$ native oxide layer on the surface of $Si_3N_4$ layer is removed, the removal amount of the STI HARP deposition may need to be controlled well, that is, the etching selectivity of the $SiO_2$ native oxide layer on the surface of $Si_3N_4$ with respect to the STI HARP deposition may need to be controlled, which may ensure the step height of the STI structure (e.g., the STI structure height which is higher than the substrate surface). The step height of the STI structure may affect the electrical properties of the device, so the step height of the STI structure may not be too high or too low.

Therefore, it is necessary to use the method of the present disclosure to remove the $SiO_2$ native oxide layer on the surface of $Si_3N_4$. FIG. 6B illustrates the device morphology after removing the $SiO_2$ native oxide layer on the surface of $Si_3N_4$. In one embodiment, the processing steps of the method for removing the silicon oxide provided by the present disclosure may be similar to the above-mentioned embodiments, which may not be described in detail herein.

The method of the present disclosure may use a high-pressure process, which may improve the etching selectivity of the $SiO_2$ native oxide layer on the surface of $Si_3N_4$ with respect to the STI HARP deposition. Therefore, the $SiO_2$ native oxide layer on the surface of $Si_3N_4$ may be removed quickly and may also avoid the excessive etching of STI HARP deposition, thereby better controlling the step height of the STI structure. Furthermore, when the $SiO_2$ native oxide layer on the surface of $Si_3N_4$ is removed, the method of the present disclosure may not generate solid reaction products, so the problem that the reaction products clog the small voids may be avoided, thereby improving the cleaning efficiency on the small voids and also capacity.

Embodiment 3: Integrated Circuit Pad Oxide Layer Removal

In one embodiment, the integrated circuit manufacturing process may include a sub-process for removing a $SiO_2$ pad oxide layer formed by oxidizing a substrate surface using a heating method, where the pad oxide layer is a buffer layer of a hard mask layer of a STI structure which is silicon nitride. The sub-process may include using the method for removing silicon oxide to etch the pad oxide layer; and controlling an etching selectivity of the pad oxide layer over a STI HARP deposition to remove the pad oxide layer with an increased speed and avoid excessive etching of the STI HARP deposition.

FIGS. 7A and 7B respectively illustrate schematics of a device having a pad oxide layer and a device after removing the pad oxide layer according to various disclosed embodiments of the present disclosure.

As shown in FIG. 7A, the pad oxide layer may be used as the buffer layer of the STI structure hard mask layer $Si_3N_4$ and may be the $SiO_2$ layer formed by thermally oxidizing the substrate surface by a tube furnace method, where the thickness may be determined according to different processes (e.g., the thickness of the $SiO_2$ layer may be about 50 Å using a 28 nm process). The pad oxide layer may need to be removed before a subsequent process. Furthermore, the STI HARP deposition in FIG. 7A may be the $SiO_2$ layer deposited by the CVD process, and the $SiO_2$ layer may have a low density. When the pad oxide layer is required to be removed, the removal amount of the STI HARP deposition may need to be controlled, that is, the etching selectivity of the pad oxide layer with respect to the STI HARP deposition may need to be controlled, which may remove the pad oxide layer quickly and may avoid excessive etching of the STI HARP, thereby ensuring the step height of the STI structure.

Therefore, it is necessary to use the method of the present disclosure to remove the pad oxide layer. FIG. 7B illustrates the device morphology after removing the pad oxide layer by the method of the present disclosure. In one embodiment, the processing steps of the method for removing the silicon oxide provided by the present disclosure may be similar to the above-mentioned embodiments, which may not be described in detail herein.

The method of the present disclosure may use a high-pressure process, which may improve the etching selectivity of the pad oxide layer with respect to the STI HARP deposition. Therefore, the pad oxide layer may be removed quickly and may also avoid the excessive etching of STI HARP, thereby controlling the step height of the STI structure. Furthermore, when the pad oxide layer is removed, the method of the present disclosure may not generate solid reaction products, so the process efficiency and capacity may be improved, and problems, such as forming divots due to the wet etching process which may affect electrical properties, may be avoided.

Embodiment 4: Removing the Native Oxide Layer Before Depositing Silicon Germanium (SiGe)

In one embodiment, the integrated circuit manufacturing process may include a sub-process for removing a $SiO_2$ native oxide layer on a silicon substrate before depositing silicon germanium. The sub-process may include using the method for removing silicon oxide to etch the $SiO_2$ native oxide layer on the silicon substrate; and controlling an etching selectivity of the $SiO_2$ native oxide layer over polysilicon to remove the $SiO_2$ native oxide layer with an increased speed and avoid excessive damage to the silicon substrate.

FIGS. 8A and 8B respectively illustrate schematics of a device having a native oxide layer and a device after removing the native oxide layer according to various disclosed embodiments of the present disclosure.

As shown in FIG. 8A, after pre-etching on the Si substrate for a subsequent SiGe deposition, the Si substrate in the etching region may be exposed to the air and be naturally oxidized, and the native oxide layer may cause problems such as the electrical property failure of the device, etc. The native oxide layer must be removed before depositing SiGe, and the Si substrate may not be damaged when the $SiO_2$ is removed. That is, the etching selectivity of the $SiO_2$ native layer to the polysilicon (e.g., the Si substrate) may be well controlled.

Therefore, it is necessary to use the method of the present disclosure to remove the $SiO_2$ native oxide layer. FIG. 8B illustrates the device morphology after removing the $SiO_2$ native oxide layer by the method of the present disclosure. In one embodiment, the processing steps of the method for removing the silicon oxide provided by the present disclosure may be similar to the above-mentioned embodiments, which may not be described in detail herein.

The method of the present disclosure may use a high-pressure process, which may improve the etching selectivity of the $SiO_2$ native layer to the polysilicon, thereby removing the $SiO_2$ native oxide layer quickly and also reducing the damage to gates and the Si substrate. Furthermore, when the $SiO_2$ native oxide layer is removed, the method of the present disclosure may not generate solid reaction products, so the problems that the solid products may be generated in the conventional technology and the Si substrate may be re-oxidized in the high-temperature sublimation process of the solid reaction products may be avoided. Therefore, the method for removing the silicon oxide provided by the present disclosure may be applied in the integrated circuit manufacturing process, which may not only improve the process efficiency and capacity and may also improve the device performance.

Embodiment 5: Removing the Native Oxide Layer Before Depositing Silicide

In one embodiment, the integrated circuit manufacturing process may include a sub-process for removing a $SiO_2$ native oxide layer on a substrate surface and a polysilicon gate surface before depositing silicide. The sub-process may include using the method for removing silicon oxide to etch the $SiO_2$ native oxide layer on the substrate surface and the polysilicon gate surface; and controlling an etching selectivity of the $SiO_2$ native oxide layer over polysilicon to remove the $SiO_2$ native oxide layer with an increased speed and avoid excessive damage to the silicon substrate.

Figure 3:
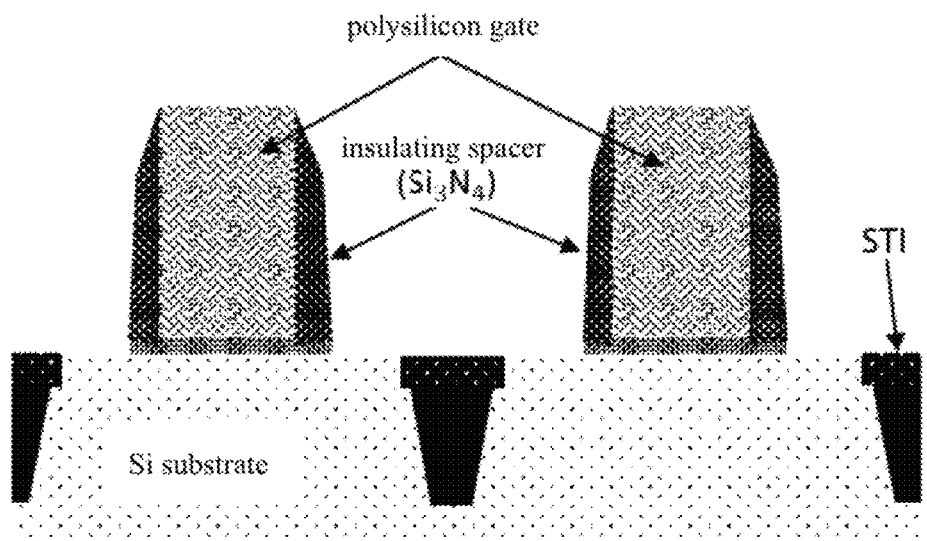
FIG. 3 illustrates a schematic of an effect of removing silicon oxide from a wafer according to various disclosed embodiments of the present disclosure.

FIGS. 1A and 3 respectively illustrate schematics of a device having a native oxide layer and a device after removing the native oxide layer according to a method of the present disclosure.

As shown in FIG. 1A, when the wafer is placed in the air, the surface of the Si substrate and the surface of the polysilicon gate may be naturally oxidized to form a dense $SiO_2$ layer. In order to avoid too large contact resistance between a contact electrode and the substrate, it may be required to remove the $SiO_2$ native oxide layer before depositing Ni or NiPt (about 5-10%) (NiPt formed in a subsequent process), however the Si substrate may not be damaged during the removal process. Furthermore, $Si_3N_4$, which may be used as insulating spacers on both sides of the polysilicon gate, may not be damaged when removing the $SiO_2$ native oxide layer.

Therefore, it is necessary to use the method of the present disclosure to remove the $SiO_2$ native oxide layer. FIG. 3 illustrates the device morphology after removing the $SiO_2$ native oxide layer by the method of the present disclosure. In one embodiment, the processing steps of the method for removing the silicon oxide provided by the present disclosure may be similar to the above-mentioned embodiments, which may not be described in detail herein.

The method of the present disclosure may use a high-pressure process, which may improve the etching selectivity of the $SiO_2$ native layer to $Si_3N_4$ and the Si substrate, thereby removing the $SiO_2$ native oxide layer on the surface of the Si substrate and the surface of the polysilicon gate quickly, reducing the damage to the polysilicon gate and the Si substrate, and also avoiding problems such as reduced sizes of the insulating spacers and increased leakage rate, etc. Furthermore, when the $SiO_2$ native oxide layer is removed, the method of the present disclosure may not generate solid reaction products, so it may avoid the problems that the $SiO_2$ removal efficiency at the bottom of the voids due to the presence of the solid reaction products in the conventional technology may be low and the Si substrate may be re-oxidized in the high-temperature sublimation process of the solid reaction products. Therefore, the method for removing the silicon oxide provided by the present disclosure may be applied in the integrated circuit manufacturing process, which may not only improve the process efficiency and capacity and may also improve the device performance.

Embodiment 6: STI HARP Oxide Recess Etching

In one embodiment, the integrated circuit manufacturing process may include a STI recess sub-process in a 2-dimensional NAND memory manufacturing process, where the NAND memory includes floating gates and dense pattern region STI HARP depositions in a dense pattern region, and control switch gates and sparse pattern region STI HARP depositions in a sparse pattern region; the floating gates and the control switch gates are made of polysilicon; the dense pattern region STI HARP depositions and the sparse pattern region STI HARP depositions are made of silicon oxide. The sub-process may include using the method for removing silicon oxide to etch the dense pattern region STI HARP depositions and the sparse pattern region STI HARP depositions; and controlling an etching selectivity of the STI HARP deposition over the floating gate or the control switch gate to remove the STI HARP depositions with an increased speed and avoid excessive damage to the floating gates and the control switch gates.

Figure 9B:
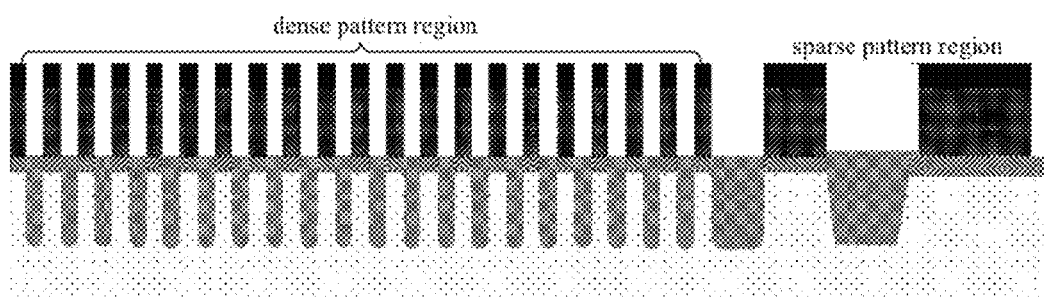

FIGS. 9A and 9B respectively illustrate schematics of an integrated circuit device having oxide recesses and an effect of removing silicon oxide of a device according to various disclosed embodiments of the present disclosure.

As shown in FIG. 9A, the STI recess process in one embodiment may be a process in a 2-dimensional NAND manufacturing process, and NAND is a memory device. In FIG. 9A, the dense pattern region on the left side may be a memory region of the device, including the floating gates (e.g., dark bars in the dense pattern region which may be polysilicon) and the dense pattern region STI HARP depositions (e.g., light bars in the dense pattern region which may be silicon oxide); and the sparse pattern region on the right side may be a control region, including source/drain selective control switch gates (e.g., dark bars in the sparse pattern region which may be polysilicon, hereinafter referred to as "control switch gates") and the sparse pattern region STI HARP depositions (e.g., light bars in the sparse pattern region which may be silicon oxide). In the STI recess process, the removal amount of the STI HARP deposition in the dense pattern region and the sparse pattern region may need to be consistent.

Therefore, it is necessary to use the method of the present disclosure to remove the STI HARP deposition. FIG. 9B illustrates the device morphology after removing silicon oxide (STI HARP deposition) by the method of the present disclosure. In one embodiment, the processing steps of the method for removing the silicon oxide provided by the present disclosure may be similar to the above-mentioned embodiments, which may not be described in detail herein.

The method of the present disclosure may use a high-pressure process, which may improve the etching selectivity of the STI HARP deposition with respect to the floating gate or with respect to the source/drain selective control switch gate, that is, the etching selectivity of the $SiO_2$ to the polysilicon, thereby removing the $SiO_2$ quickly and reducing the damage to the polysilicon. Furthermore, when the $SiO_2$ layer is removed, the method of the present disclosure may not generate solid reaction products, so it may eliminate the common problems in the conventional technology: that is, small voids may be easily to be clogged and difficult to clean due to the generation of the solid reaction products and the polysilicon may be re-oxidized in the high-temperature sublimation process of the solid reaction products. Therefore, the method for removing the silicon oxide provided by the present disclosure may be applied in the integrated circuit manufacturing process, which may not only improve the process efficiency and capacity, and may also improve the device performance.

The method and the manufacturing process for removing silicon oxide from the wafer according to the present disclosure have the following advantages.

The method provided by the present disclosure may use a gas phase etching process to remove silicon oxide from the wafer. Compared with use the wet etching process or the plasma dry etching process in the conventional technology, $SiO_2$ may be removed by chemical reactions and there may be no solid reaction products in the removal process at the present disclosure. Therefore, the reaction products may be easily pumped out, thereby keeping chamber clean, and reducing or even eliminating the particle contamination caused by the reaction products. Furthermore, since no solid reaction products are generated using the method provided by the present disclosure, there is not necessary to vaporize or liquefy the solid reaction products by high-temperature heating in the conventional technology and then discharge the vaporized or liquefied reaction products. Therefore, high-temperature heating may not be required, and the cooling step corresponding to the heating step may not be required accordingly. In such way, the reaction process may be simple, which may not only improve the process efficiency and capacity, but also save the process cost corresponding to the heating step and the cooling step.

Furthermore, the method provided by the present disclosure may use a high-pressure process (e.g., about 50 torr to 300 torr), which may improve etching selectivity of $SiO_2$ to $Si_3N_4$ (or polysilicon, HARP deposition, etc.). In such way, the removal efficiency of silicon oxide from the wafer may be improved and the damage to the substrate may be reduced.

Similarly, the integrated circuit manufacturing process provided by the present disclosure may use the method provided by the present disclosure to remove silicon oxide from the wafer. Therefore, compared with integrated circuit manufacturing process in the conventional technology using the wet etching process or the plasma etching process to remove silicon oxide, the integrated circuit manufacturing process provided by the present disclosure may also improve the removal efficiency of silicon oxide, reduce the damage to the substrate, keep the chamber clean, reduce or even eliminate the particle contamination caused by the reaction products, and may also have the characteristics of simple reaction processes, high process efficiency and capacity, low costs, etc.

The method of the present disclosure has other features and advantages, which are apparent from the accompanying drawings and the embodiments and will be described in detail in the accompanying drawings and the embodiments. The drawings and the detailed embodiments are used together to explain the principles of the present disclosure.

Those skilled in the art should understand that the above-mentioned description of the embodiments of the present disclosure is merely intended to explain the advantages of the exemplary embodiments of the present disclosure and is not intended to limit the embodiments of the present disclosure.

The above-mentioned description of the embodiments of the present disclosure is exemplary, not exhaustive, and is not limited to the embodiments disclosed. Modifications and changes are apparent to those skilled in the art without departing from the scope of the present disclosure. The choice of terms used herein is intended to explain the principles of the various embodiments, actual applications or modifications of the technology in the market, or to enable those of ordinary skill in the art to understand the embodiments disclosed herein.

What is claimed is:

1. An integrated circuit manufacturing process, comprising:
   removing silicon oxide from a wafer in a vacuum environment by a removal method, the removal method including:
      introducing a dehydrated hydrogen fluoride gas and a dehydrated alcohol gas into a process chamber;
      mixing the dehydrated hydrogen fluoride gas with the dehydrated alcohol gas to generate gaseous etchants;
      allowing reactions between the etchants and the wafer in the process chamber under a pressure about 30 torr to about 300 torr maintained in the process chamber to improve an etching selectivity;
      after completing the reactions, pumping out reaction products from the process chamber, the reaction products including non-solid reaction products;
   and performing a subsequent process in the vacuum environment;
   and performing a shallow trench isolation (STI) recess sub-process in a 2-dimensional NAND memory manufacturing process, wherein:
      the NAND memory includes:
         floating gates and STI high aspect ratio process (HARP) depositions in a dense pattern region, and
         control switch gates and STI HARP depositions in a sparse pattern region, the floating gates and the control switch gates being made of polysilicon, and the STI HARP depositions in the dense and sparse pattern regions being made of silicon oxide; and
      the sub-process includes:
         applying the removal method to remove the STI HARP depositions in the dense and sparse pattern regions; and controlling an etching selectivity of the STI HARP depositions over the floating gate or the control switch gate to remove the STI HARP depositions with an increased speed, thereby avoiding a damage to the floating gates and the control switch gates.

2. The process according to claim 1, wherein:
the pressure in the process chamber is about 200 torr.

3. The process according to claim 1, wherein:
a temperature in the process chamber is about 20° C. to about 80° C.

4. The process according to claim 3, wherein:
the temperature in the process chamber is about 40° C.

5. The process according to claim 1, wherein:
a flow rate of the dehydrated hydrogen fluoride gas is about 100 sccm to about 500 sccm; and
a flow rate of the dehydrated alcohol gas is about 100 sccm to about 1000 sccm.

6. The process according to claim 5, wherein:
the flow rate of the dehydrated hydrogen fluoride gas is about 150 sccm to about 225 sccm; and
the flow rate of the dehydrated alcohol gas is about 200 sccm to about 450 sccm.

7. The process according to claim 1, wherein:
a ratio of the flow rate of the dehydrated hydrogen fluoride gas to the flow rate of the dehydrated alcohol gas is about (0.8~1.2):1.

8. The process according to claim 7, wherein:
the ratio of the flow rate of the dehydrated hydrogen fluoride gas to the flow rate of the dehydrated alcohol gas is about 1:1.

9. The process according to claim 1, wherein:
the dehydrated alcohol gas is at least one of C1 to C8 monohydric alcohol gases.

10. The process according to claim 9, wherein:
the dehydrated alcohol gas is at least one of methanol, ethanol, or isopropyl alcohol.

* * * * *